US010217399B2

(12) United States Patent
Kim et al.

(10) Patent No.: US 10,217,399 B2
(45) Date of Patent: Feb. 26, 2019

(54) LEVEL SHIFTER AND ARRAY APPARATUS

(71) Applicant: SILICON DISPLAY TECHNOLOGY, Yongin-si (KR)

(72) Inventors: Kijoong Kim, Suwon-si (KR); Young Man Park, Gwangju-si (KR); Ji Ho Hur, Yongin-si (KR)

(73) Assignee: SILICON DISPLAY TECHNOLOGY, Yongin-si (KR)

( * ) Notice: Subject to any disclaimer, the term of this patent is extended or adjusted under 35 U.S.C. 154(b) by 133 days.

(21) Appl. No.: 15/623,577

(22) Filed: Jun. 15, 2017

(65) Prior Publication Data

US 2018/0047328 A1    Feb. 15, 2018

(30) Foreign Application Priority Data

Aug. 9, 2016    (KR) .......................... 10-2016-0101208

(51) Int. Cl.
*G09G 3/20* (2006.01)
*H03K 19/0175* (2006.01)

(52) U.S. Cl.
CPC ............. *G09G 3/2092* (2013.01); *G09G 3/20* (2013.01); *H03K 19/0175* (2013.01); *G09G 2300/0408* (2013.01); *G09G 2310/0289* (2013.01); *G09G 2310/0297* (2013.01)

(58) Field of Classification Search
CPC ...................... H03K 19/0175; H03K 19/0185
USPC ...................................... 327/333; 326/62, 63
See application file for complete search history.

(56) References Cited

U.S. PATENT DOCUMENTS 6,201,429 B1 * 3/2001 Rosenthal .......... H03K 19/0013
326/62
6,903,576 B2 * 6/2005 Narwal .................. H03K 3/012
326/68
8,779,809 B2 * 7/2014 Murakami ....... H03K 19/01714
327/112

FOREIGN PATENT DOCUMENTS

| KR | 10-2007-0105242 | 10/2007 |
| KR | 10-0956748 | 5/2010 |
| KR | 10-2010-0113408 | 10/2010 |
| KR | 10-1046579 | 7/2011 |
| KR | 10-1066226 | 9/2011 |
| WO | 2012-029872 | 3/2012 |

* cited by examiner

*Primary Examiner* — Hai L Nguyen
(74) *Attorney, Agent, or Firm* — Lex IP Meister, PLLC (57) ABSTRACT

The present invention relates to a level shifter including: a first inverter applied with a first voltage and a second voltage of different polarities and operated depending on an input voltage to output a first inverting output signal; a second inverter applied with the first voltage and the second voltage and operated depending on the first inverting output signal to output a second inverting output signal having an opposite polarity to that of the first inverting output signal; a driver applied with a third voltage and a fourth voltage, including a first load transistor having the first inverting output signal as a gate input and a second load transistor having a fifth voltage as the gate input, and outputting an output voltage having an increased level with respect to the input voltage; and a bootstrap capacitor positioned between an output terminal of the second inverter and a gate electrode of the second load transistor to help the fifth voltage to be bootstrapped depending on the second inverting output signal, and an array apparatus including the same.

15 Claims, 9 Drawing Sheets

LEVEL SHIFTER AND ARRAY APPARATUS

CROSS-REFERENCE TO RELATED APPLICATION

This application claims priority to and the benefit of Korean Patent Application No. 10-2016-0101208 filed in the Korean Intellectual Property Office on Aug. 9, 2016, the entire contents of which are incorporated herein by reference.

BACKGROUND OF THE INVENTION

(a) Field of the Invention

The present invention relates to a level shifter and an array apparatus.

(b) Description of the Related Art

A level shifter is used to raise or lower a level of a signal by adding a negative (−) or positive (+) voltage to any signal in a circuit level. The level shifter is attached to electronic equipment such as a display panel, a sensor panel, and the like to convert a low voltage signal applied from the outside into a high voltage signal to drive the panel.

Recently, while technologies to realize lighter, thinner, and smaller electronic equipment have been developed, technologies to form the level shifter in a type of an integrated circuit on the display panel or the sensor panel have been developed without configuring the level shifter with another circuit.

However, the conventional level shifter is configured by mixing P-type thin film transistors and N-type thin film transistors such that a complicated and costly CMOS process is required when forming the integrated circuit.

Also, when configuring the level shifter with the single type of thin film transistor (i.e., the P-type thin film transistor or the N-type thin film transistor), if a threshold voltage of a load thin film transistor configuring an output terminal of the level shifter is increased due to process problems of the load thin film transistor, there is a problem that the normal switching operation cannot be performed.

The above information disclosed in this Background section is only for enhancement of understanding of the background of the invention and therefore it may contain information that does not form the prior art that is already known in this country to a person of ordinary skill in the art.

SUMMARY OF THE INVENTION

An exemplary embodiment of the present invention provides a level shifter consisting only of a TFT of one channel (i.e., one type).

An exemplary embodiment of the present invention provides a level shifter in which a load thin film transistor can be stable against external influences and can operate at a high speed.

An exemplary embodiment of the present invention provides an array apparatus having the above-described level shifter.

The present invention can be used to achieve other effects that are not described in detail in addition to the aforementioned effects.

A level shifter of an exemplary embodiment of the present invention includes: a first inverter applied with a first voltage and a second voltage of different polarities and operated depending on an input voltage to output a first inverting output signal; a second inverter applied with the first voltage and the second voltage and operated depending on the first inverting output signal to output a second inverting output signal having an opposite polarity to that of the first inverting output signal; a driver applied with a third voltage and a fourth voltage, including a first load transistor having the first inverting output signal as a gate input and a second load transistor having a fifth voltage as the gate input, and outputting an output voltage having an increased level with respect to the input voltage; and a bootstrap capacitor positioned between an output terminal of the second inverter and a gate electrode of the second load transistor to help the fifth voltage to be bootstrapped depending on the second inverting output signal.

The level shifter may further include a diode transistor diode-connected to the gate electrode of the second load transistor and having the fifth voltage and the second voltage as both terminal voltages, and a driving control transistor connected to the gate electrode of the second load transistor, receiving the first voltage, and setting the fifth voltage as the first voltage when being turned on by the first inverting output signal or turned off when the fifth voltage is bootstrapped by the bootstrap capacitor depending on the second inverting output signal.

Each of the first and second inverters may include a first thin film transistor having a source electrode connected to the first voltage and a resistor having one terminal connected to the drain electrode of the first thin film transistor and the other terminal connected to the second voltage, and an inverting output signal may be generated at the drain electrode of the first thin film transistor.

The first thin film transistor may be a P-type thin film transistor, the first voltage having a positive voltage value may be applied to the source electrode, the second voltage having a negative voltage value may be applied to the drain electrode through the resistor, and the first load transistor, the second load transistor, the diode transistor, and the driving control transistor may be the P-type thin film transistor. In this case, a second thin film transistor as the P-type thin film transistor diode-connected to the drain electrode of the first thin film transistor may be used instead of the resistor.

Also, the first thin film transistor may be an N-type thin film transistor, the first voltage having a negative voltage value may be applied to the source electrode, the second voltage having the positive voltage value may be applied to the drain electrode through the resistor, and the first load transistor, the second load transistor, the diode transistor, and the driving control transistor may be the N-type thin film transistor. In this case, a third thin film transistor as the N-type thin film transistor diode-connected to the drain electrode of the first thin film transistor may be used instead of the resistor.

An array apparatus according to an exemplary embodiment of the present invention includes: a driving driver; a level shifter raising a level of a signal generated from the driving driver; and a pixel array operated by receiving the signal of which the level is raised. The level shifter includes: a first inverter applied with a first voltage and a second voltage of different polarities and operated depending on an input voltage to output a first inverting output signal; a second inverter applied with the first voltage and the second voltage and operated depending on the first inverting output signal to output a second inverting output signal having an opposite polarity to that of the first inverting output signal; a driver applied with a third voltage and a fourth voltage, including a first load transistor having the first inverting output signal as a gate input and a second load transistor having a fifth voltage as the gate input, and outputting an output voltage having an increased level raised with respect to the input voltage; and a bootstrap capacitor positioned between an output terminal of the second inverter and a gate electrode of the second load transistor to help the fifth voltage to be bootstrapped depending on the second inverting output signal.

The array apparatus may further include a base substrate, a first shift register, a second shift register, and a multiplexer, and the first shift register, the second shift register, the level shifter, and the multiplexer may be integrated and formed directly on the base substrate.

The level shifter may further include a diode transistor diode-connected to the gate electrode of the second load transistor and having the fifth voltage and the second voltage as both terminal voltages, and a driving control transistor connected to the gate electrode of the second load transistor, receiving the first voltage, and setting the fifth voltage as the first voltage when being turned on by the first inverting output signal or turned off when the fifth voltage is bootstrapped by the bootstrap capacitor depending on the second inverting output signal.

According to an exemplary embodiment of the present invention, the level shifter is only configured with the P-type or N-type thin film transistor such that the level shifter may be built in the substrate for the display panel or the sensor panel without a CMOS process.

Also, according to an exemplary embodiment of the present invention, the level shifter includes the bootstrap capacitor to further lower or raise the gate voltage of the load thin film transistor such that the load thin film transistor is operated in a linear region during the turn-on, thereby realizing the stable and high speed operation of the level shifter.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. In the drawings, irrelevant portions are omitted to clearly describe the present invention, and like reference numerals designate like elements throughout the specification. Furthermore, detailed descriptions are not given with respect to the well-known arts.

In addition, unless explicitly described to the contrary, the word "comprise" or variations such as "comprises" or "comprising" will be understood to imply the inclusion of stated elements but not the exclusion of any other elements. Also, the terms "module", "unit", and "block" used herein respectively mean one unit that processes a specific function or operation, and may be implemented by hardware or software and a combination thereof.

It will be understood that when an element or layer is referred to as being "connected to" or "coupled to" another element or layer, it can be directly connected or coupled to the other element or layer or intervening elements or layers may be present.

Now, a level shifter according to a first exemplary embodiment of the present invention will be described with reference to FIG. 1 to FIG. 9.

Figure 1:
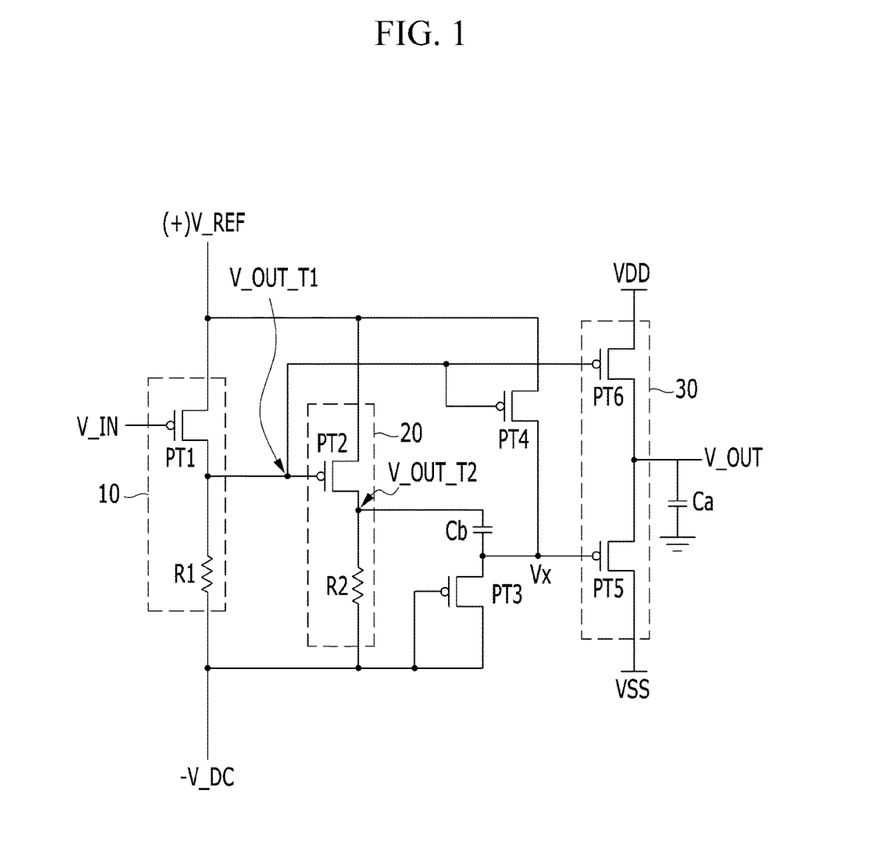
FIG. 1 is a circuit diagram of a level shifter according to a first exemplary embodiment of the present invention.

FIG. 1 is a circuit diagram of a level shifter according to a first exemplary embodiment of the present invention. Referring to FIG. 1, the level shifter according to the first exemplary embodiment of the present invention only uses a P-type transistor, and includes two inverters 10 and 20, a driver 30, a bootstrap capacitor Cb, a diode transistor PT3, and a driving control transistor PT4.

A reference voltage VREF having a positive value and a DC voltage $-V\_DC$ having a negative value are applied to the first inverter 10 of the two inverters, an input voltage V_IN is applied to the first inverter 10, and the first inverter 10 is operated depending on the input voltage V_IN to generate and output a first inverting output signal $V\_OUT_{\_T1}$. Here, the reference voltage V_REF and the DC voltage $-V\_DC$ have an arbitrary fixed voltage value. As an example, the first inverter 10 includes a first transistor PT1 having a source electrode connected to the reference voltage V_REF and the input voltage V_IN as a gate voltage, and a first resistor R1 having one terminal connected to a drain electrode of the first transistor PT1 and the other terminal connected to the DC voltage $-V\_DC$, and accordingly a first inverting output signal $V\_OUT_{\_T1}$ is generated to the drain electrode of the first transistor PT1.

The second inverter 20 of the two inverters is applied with the reference voltage VREF having the positive value and the DC voltage $-V\_DC$ having the negative value, is input with the first inverting output signal $V\_OUT_{\_T1}$, and is operated depending on the first inverting output signal $V\_OUT_{\_T1}$ to generate a second inverting output signal $V\_OUT_{\_T2}$ to be output. As an example, the second inverter 20 includes a second transistor PT2 having a source electrode to which the reference voltage V_REF is connected and a gate electrode connected to the drain electrode of the first transistor PT1, thereby having the first inverting output signal $V\_OUT_{\_T1}$ as a gate voltage, and a second resistor R1 having one terminal connected to the drain electrode of the second transistor PT2 and the other terminal connected to the DC voltage $-V\_DC$, and accordingly a second inverting output signal $V\_OUT_{\_T2}$ is generated to the drain electrode of the second transistor PT2.

The diode transistor PT3 is diode-connected to the DC voltage $-V\_DC$ to be connected to the gate of the fifth transistor PT5. The bootstrap capacitor Cb includes one terminal connected to the drain electrode of the second transistor PT2 and the other terminal connected to the gate electrode of the fifth transistor PT5. Accordingly, the voltage of the gate electrode of the fifth transistor PT5 is setup as the DC voltage −V_DC by the diode transistor PT3, and the setup DC voltage −V_DC is bootstrapped by the bootstrap capacitor Cb depending on the second inverting output signal V_OUT$_{\_T2}$.

The driving control transistor PT4 includes the source electrode connected to the reference voltage V_REF, and the drain electrode connected to the gate electrode of the fifth transistor PT5 and the source electrode of the third transistor PT3, and applies the first inverting output signal V_OUT$_{\_T1}$ as the gate voltage. Accordingly, the driving control transistor PT4 sets the gate voltage Vx of the fifth transistor PT5 as the reference voltage V_REF when being turned on, and the driving control transistor PT4 is turned off when the gate voltage Vx of the fifth transistor PT5 is bootstrapped by the bootstrap capacitor Cb depending on the second inverting output signal V_OUT$_{\_T2}$. The driving control transistor PT4 prevents the gate voltage Vx of the fifth transistor PT5 from always being the DC voltage −V_DC by the diode transistor PT3 such that the fifth transistor PT5 performs the switching operation depending on the input voltage V_IN.

The driver 30 is applied with the first driving voltage VDD and the second driving voltage VSS, and applies the first inverting output signal V_OUT$_{\_T1}$ and the gate voltage Vx as the input to generate the output voltage V_OUT. For example, the driver 30 includes the fifth transistor PT5 and the sixth transistor PT6. The voltage Vx is applied to the gate electrode of the fifth transistor PT5, the second driving voltage VSS is applied to the drain electrode of the fifth transistor PT5, and the output voltage V_OUT is output to the source electrode. The first inverting output signal V_OUT$_{\_T1}$ is applied to the gate electrode of the sixth transistor PT6, the first driving voltage VDD is applied to the source electrode, and the output voltage V_OUT is output to the drain electrode.

Next, the output signal of each element depending on the input signal V_IN in the level shifter according to the first exemplary embodiment of the present invention will be described with reference to FIG. 2.

Figure 2:
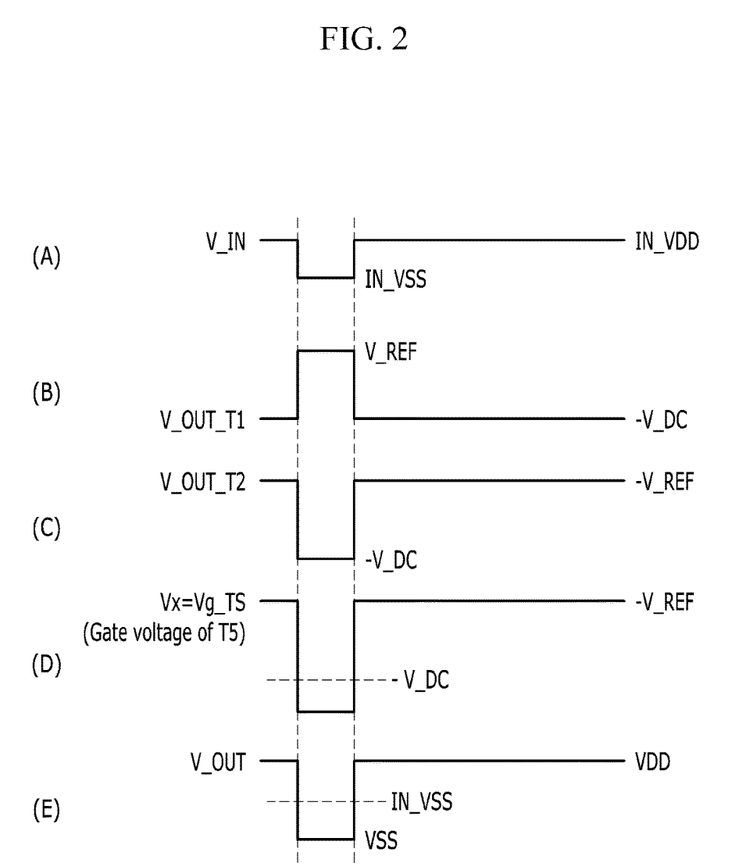
FIG. 2 is a timing diagram of input and output signals of a level shifter according to a first exemplary embodiment of the present invention.

FIG. 2 is a timing diagram of input and output signals of a level shifter according to a first exemplary embodiment of the present invention. Referring to FIG. 2, as shown in (A), in the first inverter 10, the input signal V_IN is input to the gate electrode of the first transistor PT1. If the input signal V_IN becomes the voltage IN_VSS of a low level, the first transistor PT1 is turned on and the reference voltage V_REF is formed at the drain electrode of the first transistor PT1. Accordingly, if the input signal V_IN becomes the voltage IN-VSS of the low level, the output signal of the first inverter 10, that is, the first inverting output signal V_OUT$_{\_T1}$, becomes the reference voltage V_REF as shown in (B).

The reference voltage V_REF as the output signal V_OUT$_{\_T1}$ of the first inverter 10 is input to the gate electrodes of the second, fourth, and sixth transistors PT2, PT4, and PT6, and the second, fourth, and sixth transistors PT2, PT4, and PT6 are turned off. Accordingly, at the drain electrode of the second transistor PT2, as shown in (C), the output signal of the second inverter 20, that is, the DC voltage −V_DC as the second inverting output signal V_OUT$_{\_T2}$, is formed. Here, the fourth transistor PT4 is a driving control transistor.

On the other hand, the gate voltage Vx of the fifth transistor PT5 is not only set as the DC voltage −V_DC depending on the turn-off of the fourth transistor PT4, but also the set DC voltage −V_DC is added to the voltage that is bootstrapped by the bootstrap capacitor Cb depending on the second inverting output signal V_OUT$_{\_T2}$, thereby being the lower voltage than the DC voltage −V_DC as shown in (D). Accordingly, the fifth transistor PT5 is turned on, and the output voltage V_OUT is changed from the first driving voltage VDD to the second driving voltage VSS.

Figure 3:
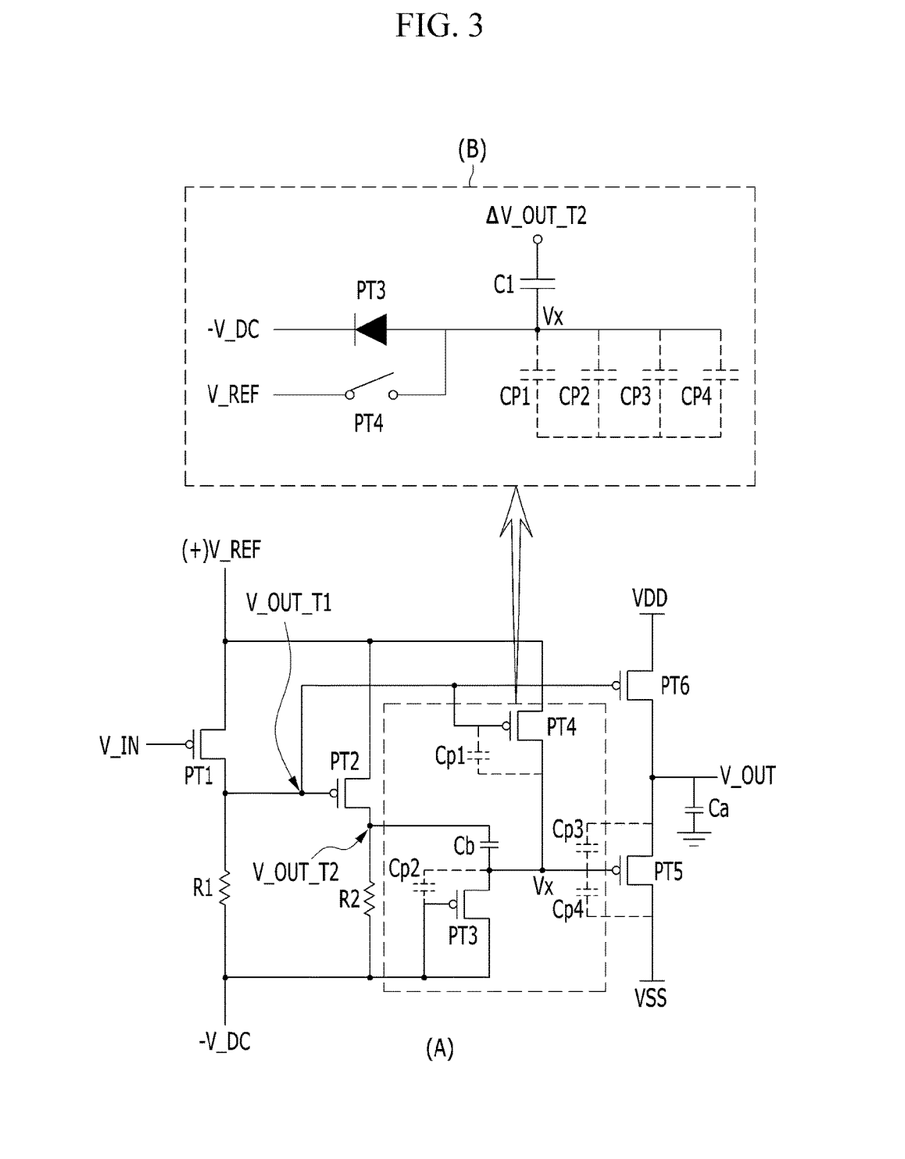
FIG. 3 is an equivalent circuit to explain an operation of main elements in a level shifter according to a first exemplary embodiment of the present invention.
Figure 4:
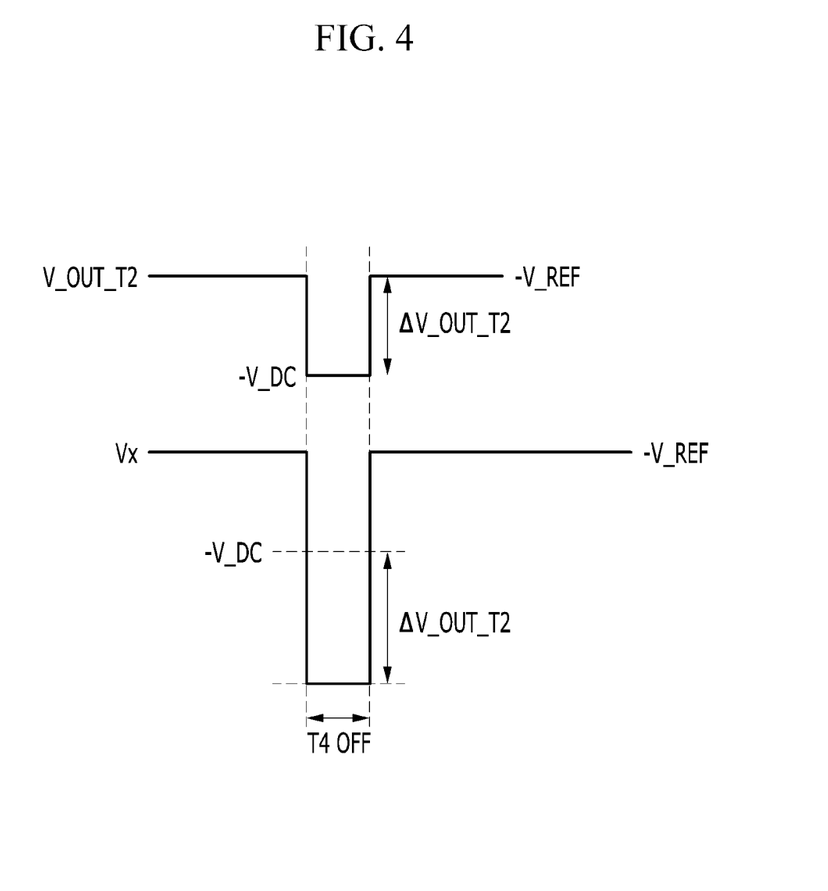
FIG. 4 is a timing diagram of a gate voltage of a fifth transistor in a level shifter according to a first exemplary embodiment of the present invention.

Next, the operations of the main elements in the level shifter according to the first exemplary embodiment of the present invention will be described with reference to FIG. 3 and FIG. 4. FIG. 3 is an equivalent circuit to explain an operation of main elements in a level shifter according to the first exemplary embodiment of the present invention, and FIG. 4 is a timing diagram of a gate voltage of a fifth transistor in a level shifter according to the first exemplary embodiment of the present invention.

In the level shifter according to the first exemplary embodiment of the present invention, as shown in FIG. 3 (A), parasitic capacitors Cp1, Cp2, Cp3, and Cp4 exist in the third to fifth transistors PT3, PT4, and PT5, and the parasitic capacitors Cp1, Cp2, Cp3, Cp, and Cp4 affect the gate voltage Vx. The gate voltage Vx is also affected by the operation of the third transistor PT3 and the fourth transistor PT4.

From the viewpoint of the gate voltage Vx, if each element affecting the gate voltage Vx is equivalently displayed, it may be represented as shown in FIG. 3 (B). Referring to FIG. 3 (B), the third transistor PT3 plays a role of a diode, and the bootstrap capacitor Cb maintains the reference voltage V_REF and the DC voltage −V_DC depending on the operation existence of the third transistor PT3 and the fourth transistor PT4 or bootstraps the gate voltage Vx of the fifth transistor PT5 depending on the second inverting output signal V_OUT$_{\_T2}$.

Also, the fourth transistor PT4 plays a role of the switch, and if the fourth transistor PT4 is in the turned-on state, the gate voltage Vx is set as the reference voltage V_REF, while if the fourth transistor PT4 is in the turned-off state, the gate voltage Vx is set as the DC voltage −V_DC. Accordingly, if the fourth transistor PT4 is turned off, as shown in FIG. 4, the bootstrap voltage is applied to the gate electrode of the fifth transistor PT5 by the bootstrap capacitor Cb and the second inverting output signal V_OUT$_{\_T2}$ as well as the DC voltage −V_DC. This can be expressed by the following Equation 1. Below, ΔV_OUT$_{\_T2}$ is the second inverting output signal value.

$$V_x = -V_{DC} + \left( \frac{Cb}{Cb + Cp1 + Cp2 + Cp3 + Cp4} \times \Delta V_{OUT_{T2}} \right) \qquad \text{(Equation 1)}$$

Resultantly, the level shifter according to the first exemplary embodiment of the present invention only consists of the P-type thin film transistors PT1, PT2, PT3, PT4, PT5, and PT6, and the gate voltage of the fifth transistor PT5 is bootstrapped by using the bootstrap capacitor Cb and the fourth transistor PT4, thereby realizing the stable and high speed operation. In detail, the level shifter according to the first exemplary embodiment of the present invention may lower the gate voltage of the fifth transistor PT5, that is, the turn-on voltage level, to the lower voltage than −V_DC, and accordingly the fifth transistor PT5 may be turned on with the stability and high speed even if the threshold voltage of the transistor PT5 is increased by a manufacturing process deviation.

Figure 5:
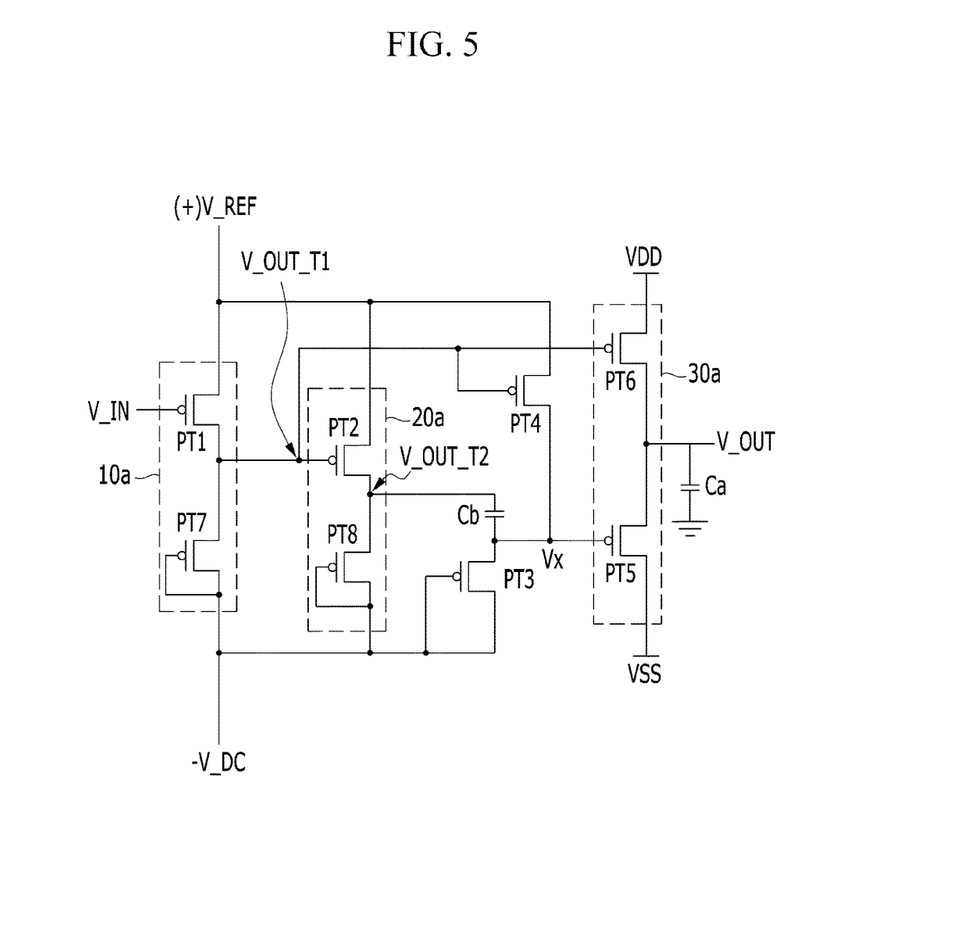
FIG. 5 is a circuit diagram of a level shifter according to a second exemplary embodiment of the present invention.

Next, a second exemplary embodiment of the present invention will be described with reference to FIG. 5. FIG. 5 is a circuit diagram of a level shifter according to a second exemplary embodiment of the present invention.

As shown in FIG. 5, the level shifter according to the second exemplary embodiment of the present invention, like the level shifter according to the first exemplary embodiment of the present invention, only uses the P-type transistor, and includes two inverters 10a and 20b, the driver 30, the bootstrap capacitor Cb, the diode transistor PT3, and the transistor PT4.

The level shifter according to the second exemplary embodiment of the present invention is almost the same as the level shifter according to the first exemplary embodiment of the present invention, however diode P-type thin film transistors PT7 and PT8 are used instead of the resistors R1 and R2 of the inverters 10 and 20. The level shifter according to the second exemplary embodiment of the present invention performs the same operation as the level shifter according to the first exemplary embodiment of the present invention and has the same effect, such that the detailed described thereof is omitted.

Next, the level shifter according to a third exemplary embodiment of the present invention will be described with reference to FIG. 6 and FIG. 7.

Figure 6:
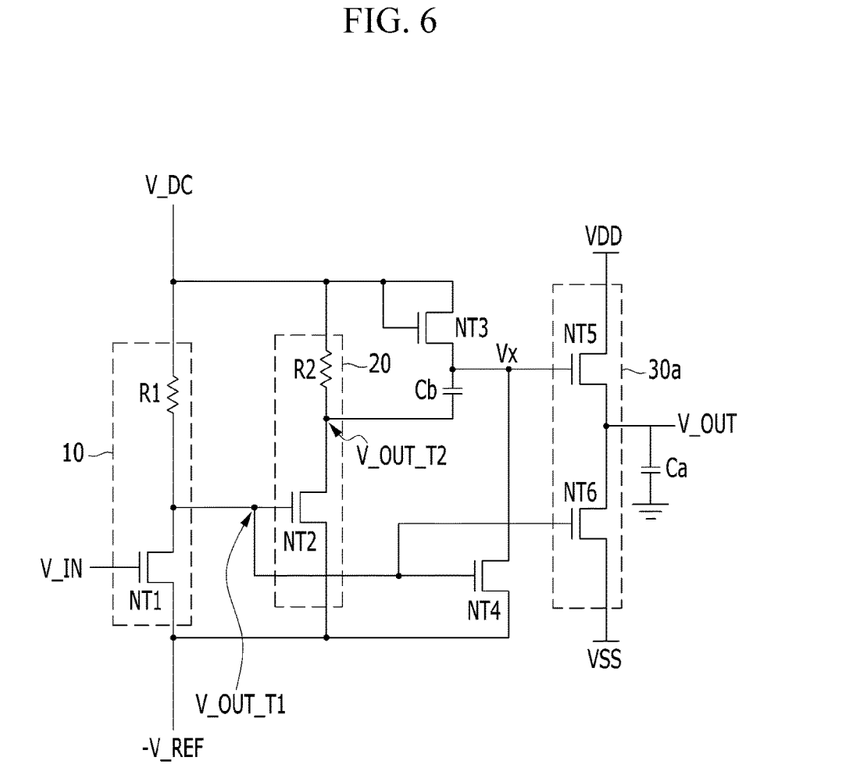
FIG. 6 is a circuit diagram of a level shifter according to a third exemplary embodiment of the present invention.
Figure 7:
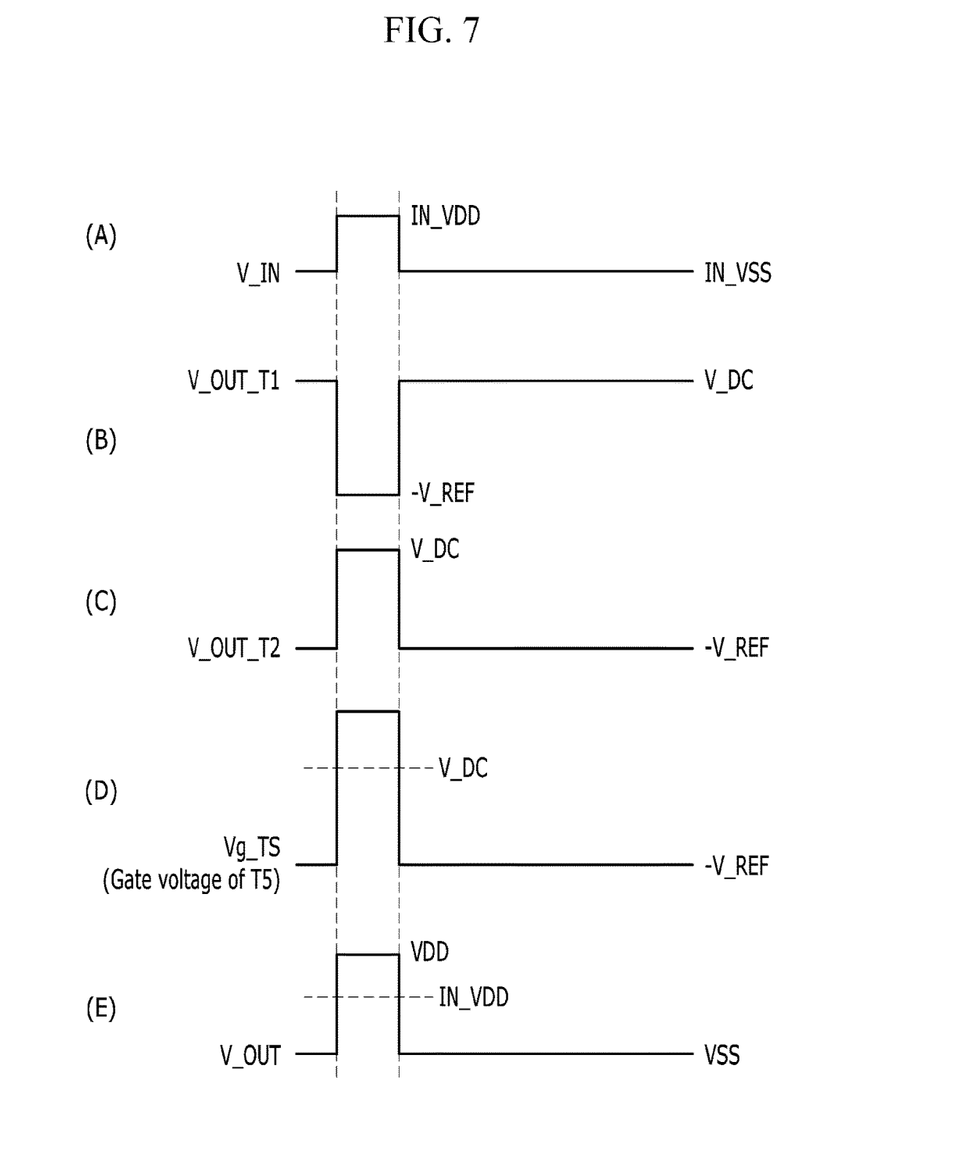
FIG. 7 is a timing diagram of input and output signals of a level shifter according to a third exemplary embodiment of the present invention.

FIG. 6 is a circuit diagram of a level shifter according to a third exemplary embodiment of the present invention, and FIG. 7 is a timing diagram of input and output signals of the level shifter according to the third exemplary embodiment of the present invention.

The level shifter according to the third exemplary embodiment of the present invention only uses an N-type transistor, and includes two inverters 10b and 20b, a driver 30b, a bootstrap capacitor Cb, a diode transistor T3, and a driving control transistor T4.

The reference voltage −VREF having the negative value and the DC voltage V_DC having the positive value are connected to both terminals of the first inverter 10b of the two inverters, and the first inverter 10b has the input voltage V_IN as the input and is operated depending on the input voltage V_IN to generate and output the first inverting output signal V_out_T1. Here, the reference voltage −V_REF and the DC voltage V_DC have the arbitrary fixed voltage value. As an example, the first inverter 10b includes the first transistor NT1 including the source electrode connected to the reference voltage −V_REF and the input voltage V_IN as the gate voltage, and the first resistor R1 having one terminal connected to the drain electrode of the first transistor NT1 and the other terminal connected to the DC voltage V_DC, and accordingly the first inverting output signal V_OUT_T1 is generated at the drain electrode of the first transistor NT1.

The second inverter 20b of the two inverters includes both terminals connected to the reference voltage −VREF having the negative value and the DC voltage V_DC having the positive value and has the first inverting output signal V_OUT_T1 as the input, and is operated depending on the first inverting output signal V_OUT_T1 to generate and output the second inverting output signal V_OUT_T2. As an example, the second inverter 20b includes the second transistor NT2 having the source electrode connected to the reference voltage −V_REF, the gate electrode connected to the drain electrode of the first transistor NT1, and the first inverting output signal V_OUT_T1 as the gate voltage, and the second resistor R1 having one terminal connected to the drain electrode of the second transistor NT2 and the other terminal connected to the DC voltage V_DC, and accordingly the second inverting output signal V_OUT_T2 is generated at the drain electrode of the second transistor NT2.

The diode transistor NT3 is diode-connected to the DC voltage V_DC to be connected to the gate of the fifth transistor NT5, and is operated to apply the DC voltage V_DC to the gate electrode of the fifth transistor NT5.

The bootstrap capacitor Cb has one terminal connected to the drain electrode of the second transistor NT2 and the other terminal connected to the gate electrode of the fifth transistor NT5. Accordingly, the voltage Vx of the gate electrode of the fifth transistor NT5 is bootstrapped by the bootstrap capacitor Cb depending on the second inverting output signal V_OUT_T2.

The transistor NT4 has the source electrode connected to the reference voltage −V_REF, the drain electrode connected to the gate electrode of the fifth transistor NT5 and the source electrode of the third transistor NT3, and the first inverting output signal V_OUT_T1 as the gate voltage. Accordingly, the driving control transistor NT4 sets the gate voltage Vx of the fifth transistor NT5 as the reference voltage −V_REF when being turned on, and the gate voltage Vx of the fifth transistor NT5 is bootstrapped by the bootstrap capacitor Cb according to the second inverting output signal V_OUT_T2 when being turned off.

The driving control transistor NT4 prevents the gate voltage Vx of the fifth transistor PT5 from being the DC voltage V_DC by the diode transistor NT3, and the fifth transistor NT5 performs the switching operation depending on the input voltage V_IN.

The driver 30b is connected to the first driving voltage VDD and the second driving voltage VSS, and applies the first inverting output signal V_OUT_T1 and the gate voltage Vx as the input to generate the output voltage V_OUT. For example, the driver 30b includes the fifth transistor NT5 and the sixth transistor NT6. The gate voltage Vx is applied to the gate electrode of the fifth transistor NT5, the first driving voltage VDD is applied to the drain electrode of the fifth transistor PT5, and the output voltage V_OUT is output to the source electrode. The first inverting output signal V_OUT_T1 is applied to the gate electrode of the sixth transistor NT6, the second driving voltage VSS is applied to the source electrode, and the output voltage V_OUT is output to the drain electrode.

If the operation of the level shifter according to the third exemplary embodiment of the present invention is described with reference to FIG. 7, as shown in FIG. 7 (A), in the first inverter 10b, the input signal V_IN is input to the gate electrode of the first transistor NT1. The first transistor NT1 is turned on if the input signal V_IN becomes the voltage IN_VDD of the high level, and as shown in FIG. 7 (B), the reference voltage −V_REF as the first inverting output signal V_OUT_T1 is formed at the drain electrode of the first transistor NT1.

The reference voltage −V_REF as the output signal V_OUT_T1 of the first inverter 10b is input to the gate electrodes of the second, fourth, and sixth transistors NT2, NT4, and NT6, and the second, fourth, and sixth transistors NT2, NT4, and NT6 are turned off. Accordingly, at the drain electrode of the second transistor NT2, as shown in FIG. 7 (C), as the output signal of the second inverter 20b, that is, the DC voltage V_DC that is the second inverting output signal V_OUT_T2, is formed. Here, the fourth transistor NT4 is the driving control transistor.

On the other hand, the gate voltage Vx of the fifth transistor NT5 is set as the DC voltage V_DC depending on the turn-ff of the fourth transistor NT4, and the voltage is added along with the DC voltage V_DC depending on the bootstrap capacitor Cb and the second inverting output signal V_OUT_T2, and as shown in FIG. 7 (D), the higher voltage than the DC voltage V_DC is formed. Accordingly, the fifth transistor NT5 is turned on, and the output voltage V_OUT is changed from the second driving voltage VSS to the first driving voltage VDD.

As another exemplary embodiment of the present invention, in the level shifter according to the third exemplary embodiment of the present invention, the diode N-type thin film transistor may be used instead of the resistors R1 and R2 of the first and second inverters 10b and 20b.

An array apparatus to which the level shifter is applied according to an exemplary embodiment of the present invention will now be described with reference to FIG. 8 and FIG. 9.

An array apparatus according to an exemplary embodiment of the present invention includes the level shifter according to an exemplary embodiment of the present invention and the driving driver providing the input voltage V_IN to the level shifter. The array apparatus including this configuration according to an exemplary embodiment of the present invention is used as a photo-sensing sensor array apparatus, a pressure sensing sensor array apparatus, a resistor variation sensor array apparatus, a capacitance sensor array apparatus, and the like, or is used in a display device such as a liquid crystal display (LCD), an organic light emitting display (OLED), and the like. Hereinafter, an example in which the array apparatus shown in FIG. 8 and FIG. 9 is applied to the display device will be described.

Figure 8:
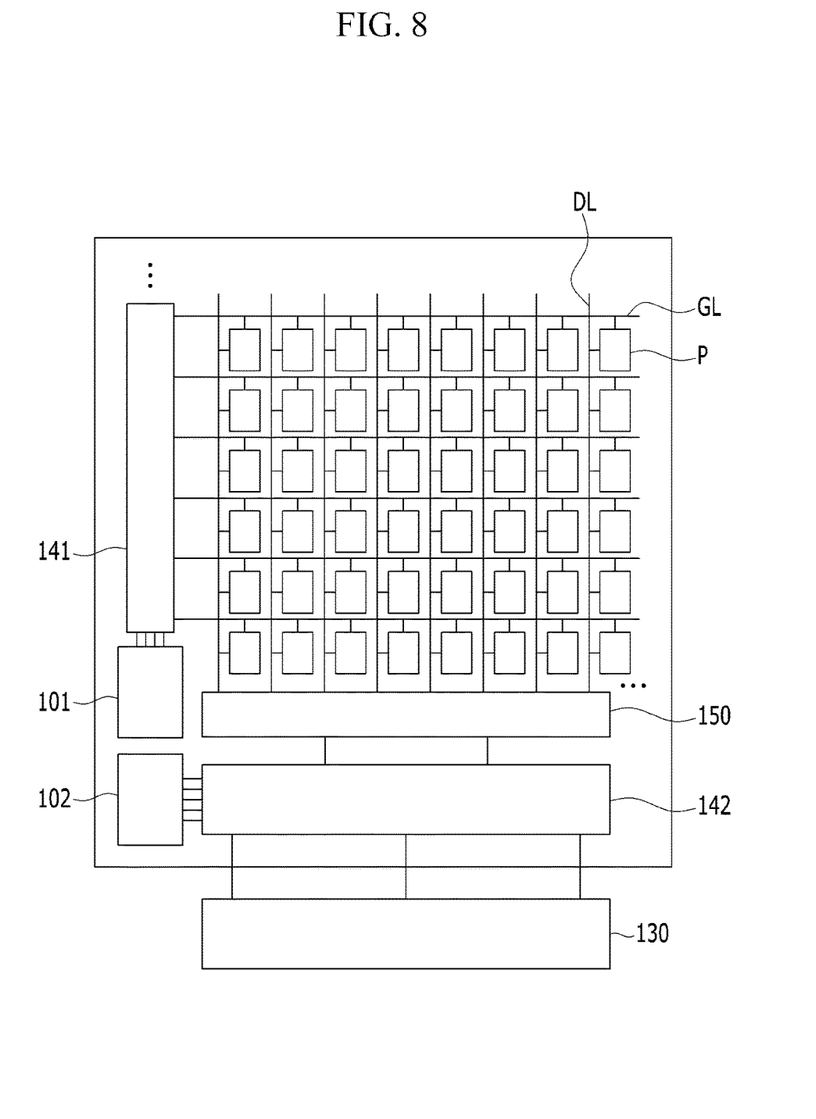
FIG. 8 is a top plan view showing an array apparatus according to a first exemplary embodiment of the present invention.

FIG. 8 is a top plan view showing an array apparatus according to a first exemplary embodiment of the present invention. Referring to FIG. 8, the array apparatus includes a first shift register 141, a second shift register 142, a first level shifter 101, a second level shifter 102, a multiplexer 150, a driving driver 130, a gate line GL, a data line DL, and a pixel P.

When manufacturing the array apparatus according to the first exemplary embodiment of the present invention with the array substrate, the first shift register 141, the second shift register 142, the first level shifter 101, the second level shifter 102, and the multiplexer 150 may be directly integrated and formed on a base substrate.

The first shift register 141 is electrically connected to the first level shifter 101 and the gate line GL to sequentially apply a gate signal to the gate line GL. The first level shifter 101 increases the level of the signal applied from the driving driver 130 to be applied to the first shift register 141. Here, the first level shifter 101 is the same as the level shifter according to an exemplary embodiment of the present invention described with reference to FIG. 1 to FIG. 7 such that the repeated description is omitted.

The second shift register 142 is electrically connected to the multiplexer 150, the driving driver 130, and the second level shifter 102. The second level shifter 102 is electrically connected to the second shift register 142 and increases the level of the signal input from the driving driver 130 to be output to the second shift register 142. Here, the second level shifter 102 is the same as the level shifter according to an exemplary embodiment of the present invention described with reference to FIG. 1 to FIG. 7 such that the repeated description is omitted.

The signal of the driving driver 130 applies a data signal to the data line DL through the second shift register 142 and the multiplexer 150 after passing through the level shifter and reads out the data signal. The pixel P is operated by using the signal applied through the gate line GL and the data line DL. For example, the array apparatus includes a pixel array formed by a plurality of pixels P. The pixel array displays an image by receiving the signal of the increased level or senses a fingerprint, a digital x-ray image, and the like. For example, the level shifter may be applied to the display device such as the liquid crystal display (LCD), the organic light emitting display (OLED), and the like, or the photo-sensing sensor array, the pressure sensing sensor array, the resistor variation sensor array, the capacitance sensor array, and the like.

The driving driver 130 may be an integrated driving driver generating a control signal to generate the gate signal and a control signal to generate the data signal, or may be a data driving driver only generating the control signal to generate the data signal.

Figure 9:
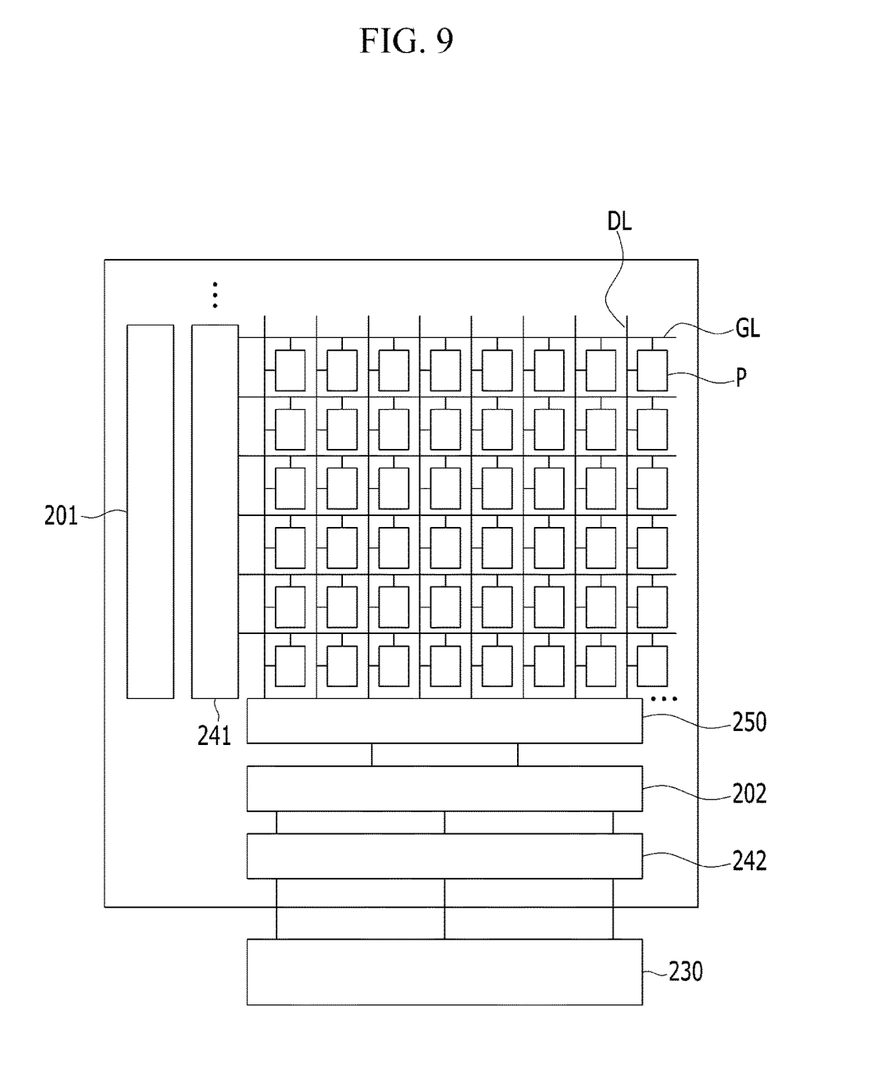
FIG. 9 is a top plan view showing an array apparatus according to a second exemplary embodiment of the present invention.

FIG. 9 is a top plan view showing an array apparatus according to a second exemplary embodiment of the present invention. The constituent elements except for the arrangement relationship of a first level shifter 201 and a second level shifter 202 in the array apparatus according to the second exemplary embodiment of the present invention are the same as in the array apparatus according to the first exemplary embodiment of the present invention such that the repeated description is omitted.

Referring to FIG. 9, the array substrate includes a first shift register 241, a second shift register 242, the first level shifter 201, the second level shifter 202, a multiplexer 250, a driving driver 230, a gate line GL, a data line DL, and a pixel P. When manufacturing the array apparatus according to the second exemplary embodiment of the present invention with the array substrate, the first shift register 241, the second shift register 242, the first level shifter 201, the second level shifter 202, and the multiplexer 250 are directly formed on the base substrate.

The first level shifter 201 receives the signal from the driving driver 230, and increases the level of the input signal to be input to the first shift register 241. Here, the first level shifter 201 is the same as the level shifter according to an exemplary embodiment of the present invention described with reference to FIG. 1 to FIG. 7 such that the repeated description is omitted.

The second level shifter 202 receives the signal from the driving driver 230 and increases the level of the input signal to be input to the second shift register 242, and the output of the second shift register 242 is input to the multiplexer 250. Here, the second level shifter 202 is the same as the level shifter according to an exemplary embodiment of the present invention described with reference to FIG. 1 to FIG. 7 such that the repeated description is omitted.

While the present invention has been described in detail with reference to the preferred embodiments, those skilled in the art will appreciate that various modifications and substitutions can be made thereto without departing from the spirit and scope of the present invention as set forth in the appended claims.

<Description of symbols>

| | |
|---|---|
| 10, 10a, 10b: first inverter | 20, 20a, 20b: second inverter |
| 30: driver | 101, 201: first level shifter |
| 102, 202: second level shifter | 141, 241: first shift register |
| 142, 242: second shift register | 150, 250: multiplexer |

What is claimed is:

1. A level shifter comprising:
   a first inverter applied with a first voltage and a second voltage of different polarities and operated depending on an input voltage to output a first inverting output signal;
   a second inverter applied with the first voltage and the second voltage and operated depending on the first inverting output signal to output a second inverting output signal having an opposite polarity to that of the first inverting output signal;
   a driver applied with a third voltage and a fourth voltage, including a first load transistor having the first inverting output signal as a gate input and a second load transistor having a fifth voltage as the gate input, and outputting an output voltage having an increased level with respect to the input voltage; and
   a bootstrap capacitor positioned between an output terminal of the second inverter and a gate electrode of the second load transistor to help the fifth voltage to be bootstrapped depending on the second inverting output signal.

2. The level shifter of claim 1, further comprising
   a diode transistor diode-connected to the gate electrode of the second load transistor and having the fifth voltage and the second voltage as both terminal voltages and a driving control transistor connected to the gate electrode of the second load transistor, receiving the first voltage, and setting the fifth voltage as the first voltage when being turned on by the first inverting output signal or turned off when the fifth voltage is bootstrapped by the bootstrap capacitor depending on the second inverting output signal.

3. The level shifter of claim 1, wherein
   at least one of the first and second inverters includes a first thin film transistor having a source electrode connected to the first voltage and a resistor having one terminal connected to the drain electrode of the first thin film transistor and the other terminal connected to the second voltage, and an inverting output signal is generated at the drain electrode of the first thin film transistor.

4. The level shifter of claim 3, wherein
   the first thin film transistor is a P-type thin film transistor, the first voltage having a positive voltage value is applied to the source electrode, the second voltage having a negative voltage value is applied to the drain electrode through the resistor, and
   the first load transistor, the second load transistor, the diode transistor, and the driving control transistor are the P-type thin film transistor.

5. The level shifter of claim 4, wherein
   a second thin film transistor as the P-type thin film transistor diode-connected to the drain electrode of the first thin film transistor is used instead of the resistor.

6. The level shifter of claim 3, wherein
   the first thin film transistor is an N-type thin film transistor, the first voltage having a negative voltage value is applied to the source electrode, the second voltage having the positive voltage value is applied to the drain electrode through the resistor, and
   the first load transistor, the second load transistor, the diode transistor, and the driving control transistor are the N-type thin film transistor.

7. The level shifter of claim 6, wherein
   a third thin film transistor as the N-type thin film transistor diode-connected to the drain electrode of the first thin film transistor is used instead of the resistor.

8. An array apparatus comprising:
   a driving driver;
   a level shifter raising a level of a signal generated from the driving driver; and
   a pixel array operated by receiving the signal of which the level is raised,
   wherein the level shift includes:
   a first inverter applied with a first voltage and a second voltage of different polarities and operated depending on an input voltage to output a first inverting output signal; a second inverter applied with the first voltage and the second voltage and operated depending on the first inverting output signal to output a second inverting output signal having an opposite polarity to that of the first inverting output signal; a driver applied with a third voltage and a fourth voltage, including a first load transistor having the first inverting output signal as a gate input and a second load transistor having a fifth voltage as the gate input, and outputting an output voltage having an increased level with respect to the input voltage; and a bootstrap capacitor positioned between an output terminal of the second inverter and a gate electrode of the second load transistor to help the fifth voltage to be bootstrapped depending on the second inverting output signal.

9. The array apparatus of claim 8, further comprising
   a base substrate, a first shift register, a second shift register, and a multiplexer, and
   the first shift register, the second shift register, the level shifter, and the multiplexer are integrated and formed directly on the base substrate.

10. The array apparatus of claim 8, wherein
    the level shifter further includes a diode transistor diode-connected to the gate electrode of the second load transistor and having the fifth voltage and the second voltage as both terminal voltages, and a driving control transistor connected to the gate electrode of the second load transistor, receiving the first voltage, and setting the fifth voltage as the first voltage when being turned on by the first inverting output signal or turned off when the fifth voltage is bootstrapped by the bootstrap capacitor depending on the second inverting output signal.

11. The array apparatus of claim 9, wherein
    at least one of the first and second inverters includes a first thin film transistor having a source electrode connected to the first voltage and a resistor having one terminal connected to the drain electrode of the first thin film transistor and the other terminal connected to the second voltage, and an inverting output signal is generated at the drain electrode of the first thin film transistor.

12. The array apparatus of claim 11, wherein
    the first thin film transistor is a P-type thin film transistor, the first voltage having a positive voltage value is applied to the source electrode, the second voltage having a negative voltage value is applied to the drain electrode through the resistor, and
    the first load transistor, the second load transistor, the diode transistor, and the driving control transistor are the P-type thin film transistor.

13. The array apparatus of claim 12, wherein
a second thin film transistor as the P-type thin film transistor diode-connected to the drain electrode of the first thin film transistor is used instead of the resistor.

14. The array apparatus of claim 11, wherein
the first thin film transistor is an N-type thin film transistor, the first voltage having a negative voltage value is applied to the source electrode, the second voltage having the positive voltage value is applied to the drain electrode through the resistor, and
the first load transistor, the second load transistor, the diode transistor, and the driving control transistor are the N-type thin film transistor.

15. The array apparatus of claim 14, wherein
a second thin film transistor as the N-type thin film transistor diode-connected to the drain electrode of the first thin film transistor is used instead of the resistor.

* * * * *